United States Patent [19]

Ito et al.

[11] Patent Number: 5,014,646
[45] Date of Patent: May 14, 1991

[54] METHOD AND APPARATUS FOR WRITING OXIDE FILM

[75] Inventors: Yufuko Ito; Hideo Koseki; Toshio Kawamura; Yasuhiko Tsukikawa, all of Osaka, Japan

[73] Assignee: Matsushita Electric Industrial Co., Ltd., Japan

[21] Appl. No.: 327,466

[22] Filed: Mar. 22, 1989

[30] Foreign Application Priority Data

Mar. 25, 1988 [JP] Japan .................................. 63-72442

[51] Int. Cl.$^5$ ........................................... C23C 16/48
[52] U.S. Cl. .................................. 118/725; 118/715; 118/722; 118/501
[58] Field of Search ............... 118/715, 722, 725, 50.1

[56] References Cited

U.S. PATENT DOCUMENTS 4,711,790 12/1987 Morishige .......................... 118/50.1

FOREIGN PATENT DOCUMENTS 59-140369 8/1984 Japan .
60-260125 12/1985 Japan .................................. 427/53.1
62-188311 8/1987 Japan .

OTHER PUBLICATIONS

"Low-Temperature Growth of Transparent and Conducting Tin Oxide Film by Photochemical Vapor Deposition" by T. Tabuchi et al.; Japanese Journal of Applied Physics, vol. 26, No. 3, Mar. 1987, pp. L186–L189.

Primary Examiner—Richard Bueker
Attorney, Agent, or Firm—Lowe, Price, LeBlanc, Becker & Shur

[57] ABSTRACT

A substrate is exposed to a gas of reactive material and an oxidizing gas. The oxidizing gas includes an ozone gas. A laser light beam is applied to the substrate through the reactive material gas and the oxidizing gas. The laser light beam activates the oxidizing gas. The activated oxidizing gas reacts with the reactive material gas to form an oxide deposited on the substrate.

32 Claims, 5 Drawing Sheets (A)

(B)

(C)

(D)

METHOD AND APPARATUS FOR WRITING OXIDE FILM

BACKGROUND OF THE INVENTION

This invention relates to a method and an apparatus for writing an oxide film.

In the field of vapor-phase growth, attention has been recently focused on a photo CVD (chemical vapor deposition) method which uses luminous energy to excite or activate gases. The photo CVD is generally better than conventional thermal CVD or plasma CVD in temperature characteristics and damaging characteristics. If a laser is used as a light source, the photo CVD enables direct writing of a film.

During the production of a film by a photo CVD method, atoms of gases of materials for the film absorb energy of applied light and are thereby activated. The activation of gas atoms advances the formation of the film. Accordingly, the selection of a light source and material gases is important in the photo CVD method.

In respect of photo CVD methods, oxide films of $SiO_2$ have been widely studied. Most of such $SiO_2$ films are formed by photo CVD methods in which a light source is a lamp generating light with a wavelength equal to or shorter than 200 nm; a gas source includes $SiH_4$ or $Si_2H_6$; and an oxidizing gas is $O_2$. The reason for the use of such a light source is that $SiH_4$ gas absorbs light with a wavelength equal to or shorter than 160 nm and $Si_2H_6$ gas and $O_2$ gas absorb light with a wavelength equal to or shorter than 200 nm. In some cases, the lamp of the light source is replaced by an excimer laser. All of known photo CVD methods related to $SiO_2$ films are intended to merely form a two-dimensional film and are incapable of directly writing a film.

Japanese Journal of Applied Physics, Vol 126, No. 3, PPL 186, relates to a photo CVD method of forming a film of $SnO_2$. In this photo CVD method, a light source is composed of a mercury lamp emitting light with wavelengths of 185 nm and 254, and an $O_2$ gas and a tin compound gas are used as gas sources. The photolysis of $O_2$ molecules by the 185-nm light triggers a reaction forming the $SnO_2$ film.

The inventors of this application and others achieved directly writing of an $SnO_2$ film on a glass substrate by a method in which a $CO_2$ laser is used to locally heat a surface of the substrate. In this method, the heat caused a significant damage to the substrate and the material for the substrate is considerably limited.

Light CVD methods using lasers are referred to as laser CVD methods. The laser CVD methods feature that the density of luminous energy is high and the beam of light is coherent and directive. Accordingly, it seems possible for a laser CVD method to quicky form a localized film through a film-directly-writing process.

In the field of metal materials, directly writing methods by laser CVD have been studied in revising wiring patterns or mask patterns.

SUMMARY OF THE INVENTION

It is an object of this invention to provide an excellent method and an excellent apparatus for writing an oxide film.

In this invention, a substrate is exposed to a gas of reactive material and an oxidizing gas. The oxidizing gas includes an ozone gas. A laser light beam is applied to the substrate through the reactive material gas and the oxidizing gas. The laser light beam activates the oxidizing gas. The activated oxidizing gas reacts with the reactive material gas to form an oxide deposited on the substrate.

BRIEF DESCRIPTION OF THE INVENTION

Like and corresponding elements are denoted by the same reference characters throughout the drawings.

DESCRIPTION OF THE FIRST PREFERRED EMBODIMENT

Figure 1:
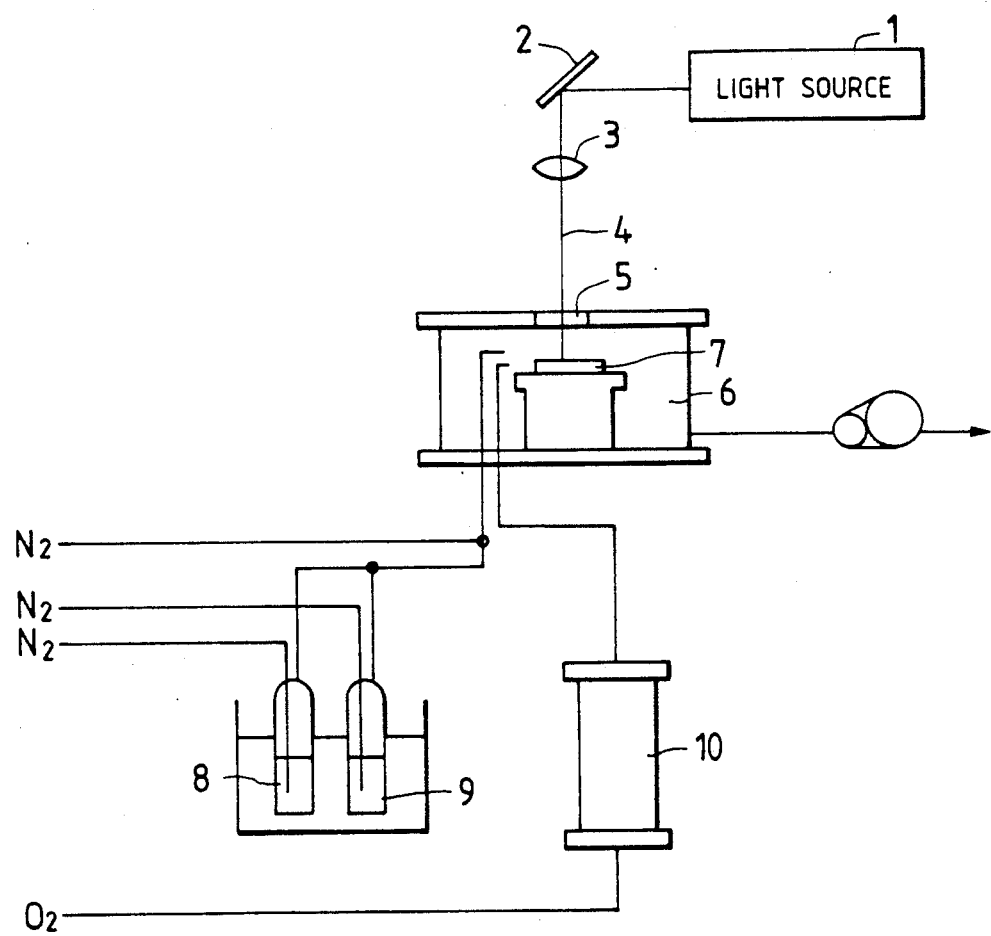
FIG. 1 is a diagram of an apparatus according to first and second embodiments of this invention.

With reference to FIG. 1, a light source 1 is composed of a YAG (yttrium aluminum garnet) laser. The fourth harmonic of the YAG laser light is used. The fourth harmonic has a wavelength of 266 nm. It should be noted that the light source 1 may be composed of other lasers such as an excimer laser or an Ar laser emitting the second harmonic light with a wavelength of 257 nm.

The laser light beam 4 from the source 1 is reflected by a mirror 2 toward a lens 3. The light beam 4 passes through the lens 3 and then moves into a sealed chamber 6 via a window 5. A substrate 7 located within the chamber 6 is exposed to the light beam 4.

A bubbling device 8 contains liquid of reactive material. Nitrogen gas supplied to the bubbling device 8 bubbles the reactive material liquid and thereby vaporizes the reactive material liquid to form a gas of the reactive material. The gas of the reactive material is supplied from the bubbling device 8 into the chamber 6. The reactive material liquid within the bubbling device 8 is held at a preset temperature by a constant temperature bath (no reference numeral). The reactive material is preferably composed of tetramethyl-tin.

A bubbling device 9 contains liquid of doping material. Nitrogen gas supplied to the bubbling device 9 bubbles the doping material liquid and thereby vaporizes the doping material liquid to form a gas of the doping material. The gas of the doping material is introduced into a line of transmission of the reactive material gas so that the doping material gas is added to the reactive material gas. The resulting mixture of the reactive material gas and the doping material gas is then supplied into the chamber 6. In this way, the gas of the doping material is supplied from the bubbling device 9 into the chamber 6. The doping material liquid within the bubbling device 9 is held at a preset temperature by the constant temperature bath. In this embodiment, the bubbling device 9 is held at rest.

An oxidizing gas is supplied into the chamber 6 from a device 10. The oxidizing gas is preferably composed of a mixture of oxygen gas and ozone gas. The device 10 includes a commercially available ozone generator called "an ozonizer". The ozonizer 9 converts a percentage of an oxygen gas into an ozone gas and the supplies a mixture of the oxygen gas and the ozone gas to the chamber 6.

The gases are drawn from the chamber 6 by a pump (no reference numeral).

The light beam 4 reaches the surface of the substrate 7 through the reactive material gas and the oxidizing gas which surround the surface of the substrate. The light beam activates the oxidizing gas. The activated oxidizing gas reacts with the reactive material gas to form an oxide deposited on the substrate 7. It was experimentally found that a film of SnO$_2$ was formed or deposited on the substrate 7.

Figure 2:
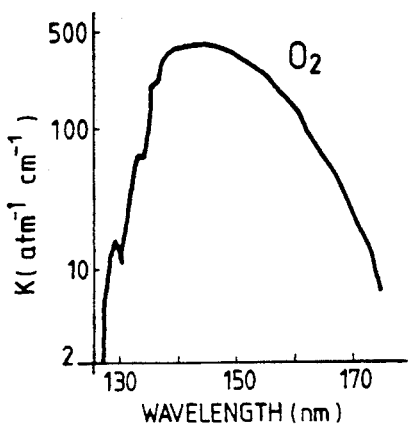
FIG. 2 shows graphs of the light absorption characteristics of several oxidizing gases.
Figure 2:
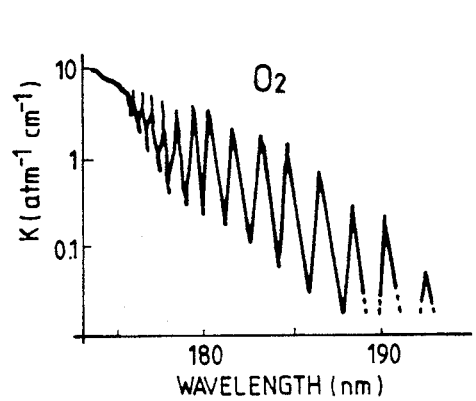
Figure 2:
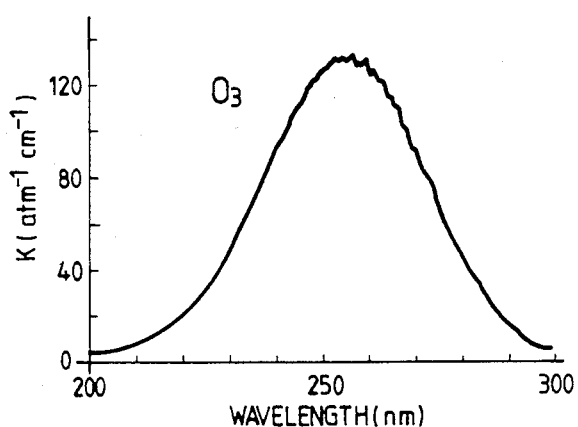
Figure 2:
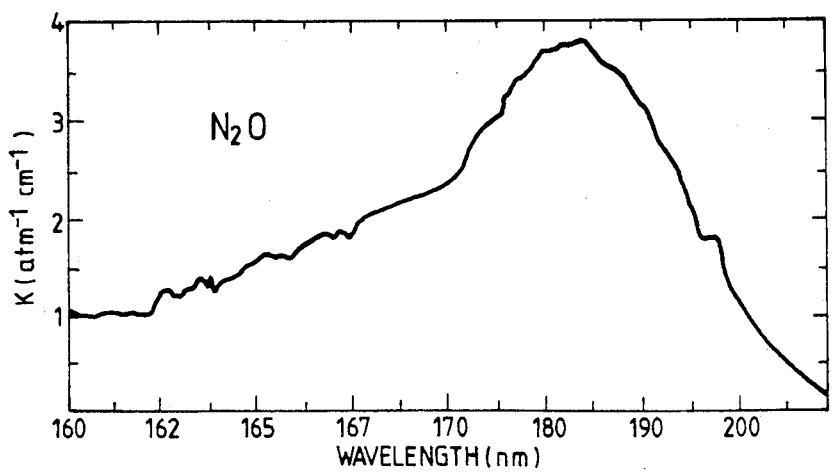

FIGS. 2(A) and 2(B) show light absorption characteristics of an oxygen gas. FIG. 2(C) shows light absorption characteristics of an ozone gas. FIG. 2(D) shows light absorption characteristics of an N$_2$O gas. As understood from the drawings of FIG. 2, the ozone gas absorbs light with a wavelength of 200-300 nm at higher rates than the corresponding light absorption rates of the other gases. It is known that the ozone gas efficiently undergoes photolysis and generates oxygen radicals in response to light with a wavelength of 200-300 nm. Accordingly, the combination of an oxidizing material gas including an ozone gas and a laser emitting light of a 200-300 nm wavelength enables laser CVD which can perform directly writing of an oxide film.

Experiments were performed as follows. The laser light beam was enlarged by the lens 3 to a diameter of about 20 mm. During the formation of a film, the intensity of the light at the surface of the substrate 7 was about 5 mW/cm$^2$ so that the application of the light to the substrate 7 did not cause any appreciable increase in the temperature of the surface of the substrate 7. The light beam outputted from the source 1 was in the form of a train of pulses. The pressure within the chamber 6 was 10 Torr. The temperature of the tetramethyl-tin liquid was 15° C. The rate of supply of the nitrogen gas into the bubbling device 8 was 50 cc/min. The rate of supply of the mixture of the oxygen gas and the ozone gas to the chamber 6 was 200 cc/min. In the ozonizer 10, the percentage of the oxygen gas which was converted to the ozone gas was about 1-2% in mole ratio. It is known that the light absorption coefficient of the tetramethyl-tin with respect to light of a wavelength of 266 nm is about 1.0 cm$^{-1}$mol$^{-1}$. The substrate 7 was made of pylex glass. The temperature of the substrate 7 was controlled by a heater provided to a base supporting the substrate 7.

Figure 3:
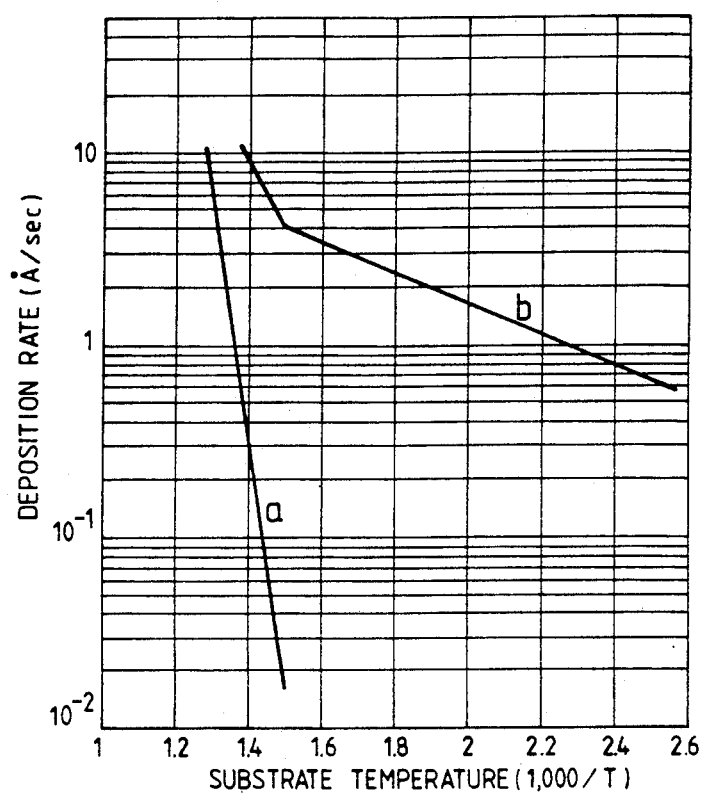
FIG. 3 is a graph of the relationship between the temperature of the substrate and the deposition rate of the oxide film in the embodiments of FIG. 1.

FIG. 3 shows experimental results of the speeds of formation or deposition of SnO$_2$ films. The line "a" of FIG. 3 denotes data which were obtained under conditions where the oxygen-to-ozone conversion in the ozonizer 10 was at rest and pure oxygen gas was supplied to the chamber 6. Under these conditions, a film was formed at temperatures equal to or above about 350° C. at which the pyrolysis of tetramethyl-tin starts. Accordingly, in the case of a combination of pure oxygen gas and tetramethyl-tin gas, the application of light with a wavelength of 266 nm fails to advance the photolysis which causes the formation of an SnO$_2$ film. The line "b" of FIG. 3 denotes data which were obtained under conditions where the oxygen-to-ozone conversion in the ozonizer 10 was in operation and the mixture of the oxygen gas and the ozone gas was supplied to the chamber 6. Under these conditions, the growth of an SnO$_2$ film was confirmed even at a temperature of 100° C. Accordingly, it is clear that the ozone gas effectively promotes the photolysis which causes the formation of an SnO$_2$ film. When the comparison between the two cases related to the respective data "a" and "b" is considered, it can be assumed that the photolytic reaction and the oxidizing reaction are performed in the following processes.

LIGHT

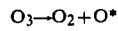

$$O_3 \rightarrow O_2 + O^*$$

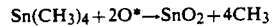

$$Sn(CH_3)_4 + 2O^* \rightarrow SnO_2 + 4CH_3$$

where the character "*" denotes that atoms whose symbols are immediately followed by this character are active.

Accordingly, in cases where oxidizing gas effectively promotes photolysis as ozone gas does, even when the photolysis of oxidized material gas can not be performed directly by used light, a second or higher-order reaction caused by oxygen radicals allows the oxidized material gas to be converted into an oxide film. It was found that the SnO$_2$ film which was obtained at a temperature of 100° C. was free from carbon components.

Figure 4:
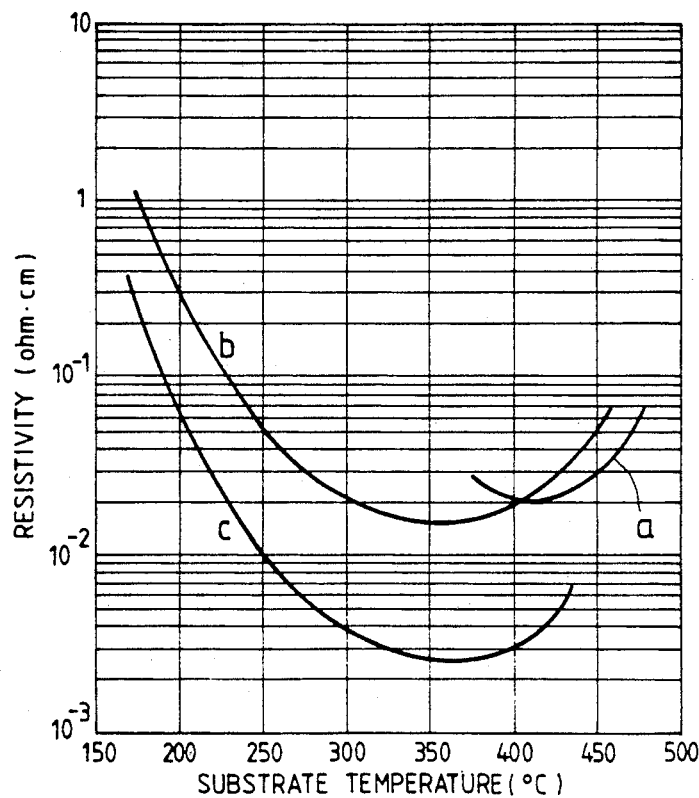
FIG. 4 is a graph of the relationship between the temperature of the substrate and the resistivity of the resultant oxide film in the embodiments of FIG. 1.

FIG. 4 shows experimental results of the relationship between the resistivity of SnO$_2$ films and the temperature of substrates. The curve "a" of FIG. 4 denotes data which were obtained in respect of SnO$_2$ films formed by a thermal CVD method. The curve "b" of FIG. 4 denotes data which were obtained in respect of SnO$_2$ films formed by the photo CVD method of this embodiment. As understood from FIG. 4, this embodiment can produce SnO$_2$ films at lower temperatures than the thermal CVD method. In each of the temperature-resistivity curves "a" and "b", an increased resistivity at lower temperatures are caused by a decrease in the mobility of charges due to an increased degree of amorphousness of formed SnO$_2$ films while an increased resistivity at higher temperatures are caused by a decrease in the density of free charges due to a decreased number of lattice defects.

A description will now be made as to experiments on directly writing of an SnO$_2$ film on the pylex substrate 7. The light beam 4 was condensed into a diameter of 100 micrometers at the surface of the substrate 7. While the substrate 7 was not heated, the light beam was moved so that the substrate 7 was scanned by the light beam at a speed of about 10 micrometer/second. The light beam was in the form of a train of pulses with a frequency of 3 KHz. Other conditions were similar to those of the previously-mentioned experiments. A linear electrode film of SnO$_2$ was formed on the substrate 7. The thickness of the SnO$_2$ film was about 2,000 angstroms. The resistivity of the SnO$_2$ film was about $10^{-2} \Omega$ cm. The reason why such a good resistivity was obtained without heating seems to be as follows. The application of the condensed light beam to the surface of the substrate 7 causes a temperature increase to occur locally at the surface of the substrate 7.

After the SnO$_2$ film was etched away from the substrate 7, the profile of the surface of the substrate 7 was measured. The results of this measurement showed that the surface of the substrate 7 was normal in flatness.

An electrode film of SnO$_2$ was formed on a layer of polyimide resin in a similar way. The characteristics of this SnO$_2$ electrode film were similar to those of the previously-mentioned SnO$_2$ film. The polyimide resin layer extended on a glass and had a thickness of about 7 micrometers. The polyimide resin layer had a thermal characteristic such that it was able to resist temperatures up to 250° C. In this case, the deposition of the $SnO_2$ film did not cause any change in quality and color of a substrate including the polyimide resin layer.

As understood from the previous description, the application of the light beam to the surface of the substrate 7 causes an effective temperature increase only in a restricted portion of the substrate 7 which extends at or very close to the surface thereof. The effective temperature increase enables the good characteristics of the $SnO_2$ film. Other portions of the substrate 7 are free from such a considerable temperature increase and are thus prevented from changing in quality. In order to maintain such desirable conditions of the forming of an $SnO_2$ film, it is preferable that the peak power output of the light source 1 is held as low as possible and that the pulse frequency of the light beam is 1 KHz or higher.

As shown in FIG. 1, the outlet of a line of transmission of the reactive material gas and the outlet of a line of transmission of the oxidizing gas are separate from and independent of each other. The locations of these outlets are chosen so that the reactive material gas and the oxidizing gas meet in a region immediately above the surface of the substrate 7. This choice of the outlet locations prevents the ozone gas from reacting with the oxidized material gas and thereby forming powder in unwanted regions. In summary, it is preferable that the points of injection of the reactive material gas and the oxidizing gas are close to the portions of the surface of the substrate 7 which is exposed to the light beam.

DESCRIPTION OF THE SECOND PREFERRED EMBODIMENT

A second embodiment of this invention is similar to the embodiment of FIGS. 1-4 except that a bubbling device 9 is activated during the formation of an $SnO_2$ film. The bubbling device 9 adds a gas of doping material to a gas of reactive material to form a gas mixture supplied to a chamber 6.

The curve "c" of FIG. 4 denotes temperature-resistivity data which were obtained in respect of $SnO_2$ films formed in this embodiment under conditions where the doping material was $SbCl_5$ and where the mixing rate of the doping material to the reactive material gas was about 3% in mole ratio. As understood from FIG. 4, the addition of the doping material to the reactive material causes a decrease in the resistivity of a resultant $SnO_2$ film. It should be note that doping materials other than the Sb doping material may be used.

DESCRIPTION OF THE THIRD PREFERRED EMBODIMENT

Figure 5:
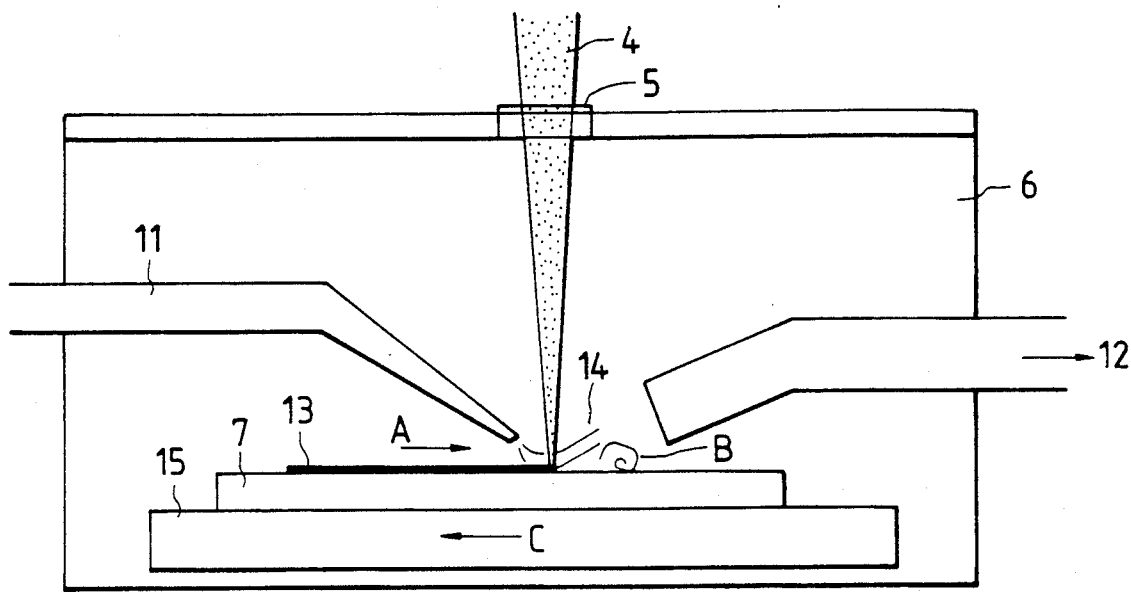
FIG. 5 is a diagram of an apparatus according to a third embodiment of this invention.

FIG. 5 shows a third embodiment of this invention which is similar to the embodiment of FIGS. 1-4 except for design changes described hereafter.

In the embodiment of FIG. 5, reactive material gas is injected into a chamber 6 via a nozzle 11 fixed to walls defining the chamber 6. An outlet opening of the nozzle 11 is located at a position immediately above a surface of a substrate 7 so that the injection of the reactive gas into the chamber 6 occurs at that position. The outlet of the nozzle 11 extends obliquely to the surface of the substrate 7 so that a stream of the reactive material gas starts from the outlet opening of the nozzle 11 toward the surface of the substrate 7 in a direction inclined with respect to the surface of the substrate 7.

It is preferable that oxidizing gas is also injected via a similar nozzle into a region of the chamber 6 immediately above the surface of the substrate 7. In addition, it is preferable that the walls of the chamber 6 are held at a low temperature.

The substrate 7 is mounted on a stage 15 which is movable relative to the walls of the chamber 6 by a suitable sliding mechanism. It is preferable that the stage 15 is movable two-dimensionally. As the substrate 7 is moved together with the stage 15 along a direction "C", a line of an $SnO_2$ film 13 is formed or written on the substrate 7.

An exhaust pipe 12 fixed to the walls of the chamber 6 extends from the chamber 6 through the walls of the chamber 6. An inlet opening of the exhaust pipe 12 extends immediately above the surface of the substrate 7. The gases are drawn from the chamber 6 via the exhaust pipe 12. The inlet of the exhaust pipe 12 extends obliquely to the surface of the substrate 7 and opposes the outlet of the nozzle 11. A light beam travels to the surface of the substrate 7 via a path between the outlet of the nozzle 11 and the inlet of the exhaust pipe 12.

A main stream of the reactive gas starts from the outlet opening of the nozzle 11 and terminates at the inlet opening of the exhaust pipe 12 via a region adjoining the surface of the substrate 7. In the region adjoining the surface of the substrate 7, the direction of the main stream of the reactive material gas essentially agrees with a direction "A" opposite to the direction "C".

In cases where the substrate 7 was moved together with the stage 15 along the direction "C", a written $SnO_2$ film 13 was adequately transparent. In cases where the substrate 7 was moved together with the stage 15, along the direction "A", a written $SnO_2$ film was inadequately transparent. This phenomenon seems to result from the following cause. In the latter cases, when the main stream of the reactive material gas meets the surface of the substrate 7, turbulence "B" occurs in a region downstream of the meeting point. This turbulence "B" adversely affects a surface of the written $SnO_2$ film.

As understood from the previous description, it is important to prevent turbulence. In order to reliably prevent turbulence, it is preferable that the outlet opening of the nozzle 11 and the inlet opening of the exhaust pipe 12 are close to the surface of the substrate 7. For example, a gap of several millimeters or less is set between the outlet opening of the nozzle 11 and the point where the light beam 4 meets the surface of the substrate 7. A similar gap is set between the inlet opening of the exhaust pipe 12 and that point. The direction of the injection of the reactive material gas into the chamber 6 via the nozzle 11 preferably forms an angle of 45° or less with respect to the surface of the substrate 7. The pressure of the injection of the reactive material gas is preferably chosen so that the reactive gas forms a laminar flow in the nozzle 11.

In a modification of this embodiment, a stage 15 is fixed to walls of a chamber 6, and a laser beam 4 and a nozzle 11 are movable together relative to the stage 15. In this modification, it is preferable that the laser beam 4 moves relative to a substrate 7 in a direction opposite to the direction of a stream of reactive material gas immediately above the surface of the substrate 7.

DESCRIPTION OF THE FOURTH PREFERRED EMBODIMENT

Figure 6:
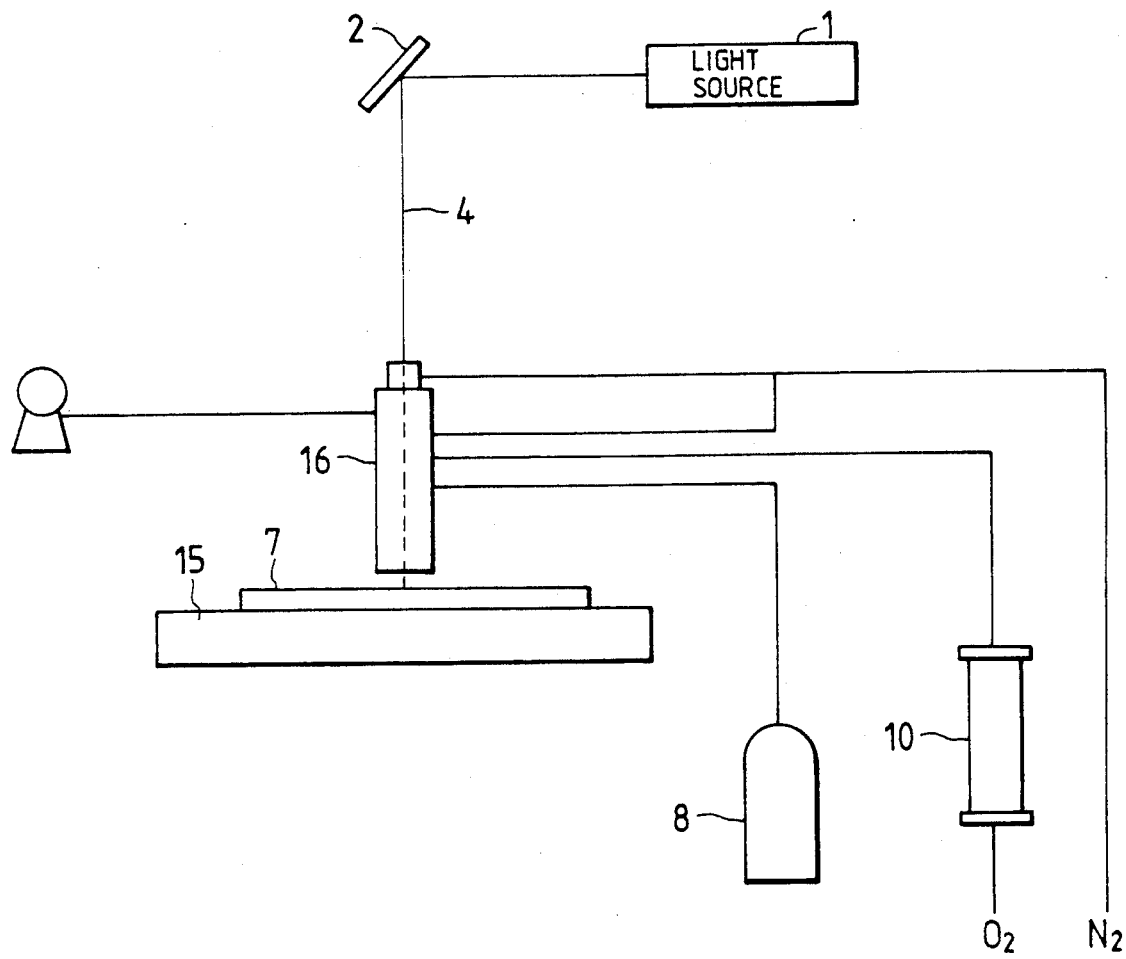
FIG. 6 is a diagram of an apparatus according to a fourth embodiment of this invention.

With reference to FIG. 6, a light source 1 is composed of a YAG (yttrium aluminum garnet) laser. The fourth harmonic of the YAG laser light is used. The fourth harmonic has a wavelength of 266 nm. It should be noted that the light source 1 may be composed of other lasers such as an excimer laser or an Ar laser emitting the second harmonic light with a wavelength of 257 nm.

The laser light beam 4 from the source 1 is reflected by a mirror 2 toward a gas supply and exhaust system 16. The light beam 4 passes through the system 16 and then reaches a surface of a substrate 7 mounted on a stage 15. This embodiment features that a sealed chamber accommodating the substrate 7 is omitted.

A device 8 supplies a gas of reactive material to the system 16. The reactive material is preferably composed of tetramethyl-tin. An ozonizer 10 supplies a mixture of oxygen gas and ozone gas to the system 16. The system 16 is also supplied with nitrogen gas. The gases are drawn from the system 16 via a pump (no reference numeral).

Figure 7:
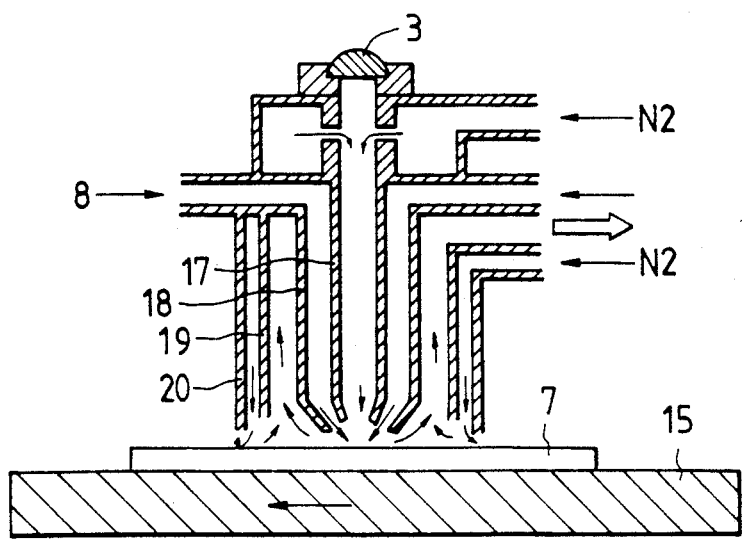
FIG. 7 is a sectional view of the gas supply and exhaust system of FIG. 6.

As shown in FIG. 7, the system 16 includes a lens 3 condensing the light beam 4. The system 16 has four concentrical tubes or cylinders 17, 18, 19, and 20 which open at positions immediately above the surface of the substrate 7. The innermost cylinder 17 defines a passage extending below the lens 3. The light beam 4 passes through the passage within the innermost cylinder 17. The nitrogen is driven through the passage within the innermost cylinder 17, and a portion of the nitrogen gas is directed toward a lower surface of the lens 3. The supplied nitrogen gas prevents the reactive material gas from entering the interior of the innermost cylinder 17 and from forming a film below the lower surface of the lens 3 which would decrease the transimittance of the lens 3.

The passage defined between the innermost cylinder 17 and the adjacent cylinder 18 is separated by a partition wall (not shown) into first and second subpassages. The reactive material gas and the mixture of the oxygen gas and the ozone gas are injected respectively via the first and second subpassages between the innermost cylinder 17 and the adjacent cylinder 18 toward the point of the surface of the substrate 7 which is exposed to the light beam 4. The reactive material gas and the mixture of the oxygen gas and the ozone gas meet at a region immediately above the light-exposed point of the surface of the substrate 7. The gases are drawn from a region above the surface of the substrate 7 via the passage defined between the cylinders 18 and 19. The nitrogen gas is injected vertically toward the surface of the substrate 7 from the passage defined between the outermost cylinder 20 and the adjacent cylinder 19. The injected nitrogen gas forms a cylindrical stream serving as a curtain which prevents the reactive material gas, the mixture of the oxygen gas and the ozone gas, and other gases from leaking into the atmosphere. In order to ensure the prevention of the gas leakage, it is preferable that an lower edge of the outermost cylinder 20 is close to the surface of the substrate 7.

Additional cylinders may be provided outside the cylinder 20 to enable other sucking of the gases and the formation of another nitrogen gas curtain.

From the standpoint of the prevention of wasteful supply of the gases, it is preferable that the diameters of the cylinders 17 and 18 are small. For example, the inside diameter of the cylinder 17 is about 1 mm or less. The gap between the cylinders 17 and 18 is preferably about 0.5 mm or less.

The pressure of the nitrogen gas injected via the passage within the innermost cylinder 17 is preferably lower than the pressures of the reactive material gas and the oxidizing gas injected via the passages between the cylinders 17 and 18 so that the reactive material gas and the oxidizing gas can reliably reach the light-exposed point of the surface of the substrate 7.

It was experimentally found that the concentration of ozone was 0.001 ppm or less at a point 5 cm away from the system 16. Furthermore, it was experimentally confirmed that the characteristics of an $SnO_2$ film formed in this embodiment were similar to those of $SnO_2$ films of the embodiments of FIGS. 1–5.

It is desirable to prevent turbulence in the stream of the injected reactive material gas. The prevention of such turbulence is ensured by the following designs. The cylinders 17 and 18 define a nozzle via which the reactive material gas is injected. The outlet opening of the nozzle is in the form of a partial circle or ring. Accordingly, the nozzle allows a linear stream of the injected reactive material gas which is directed toward the light-exposed point of the surface of the substrate 7. The cylinders 18 and 19 define a gas sucking inlet which are opposed to the outlet opening of the nozzle to allow the injected reactive material gas to smoothly move toward the gas sucking inlet along one direction.

DESCRIPTION OF THE MODIFICATIONS OF THE EMBODIMENTS

In the embodiments of FIGS. 1–7, suitable gas containing tin may be used in place of the tetramethyl-tin gas. In addition, silane gases and various gases of alkyl metals may be used as the gas of reactive material. In this case, films of $In_2O_3$, $SiO_2$, $Al_2O_3$, $K_3Li_2NbO_{15}$, indium tin oxide (ITO), and other oxides are formed on substrates.

In the embodiments of FIGS. 1–7, the YAG laser may be replaced by a suitable laser generating light with a wavelength in the range of 200–300 nm.

What is claimed is:

1. An apparatus for writing an oxide film, comprising:
   means for supplying a gas of reactive material;
   means for converting at least part of an oxygen gas into an ozone gas to generate an oxidizing gas including the ozone gas;
   means for supplying the oxidizing gas including the ozone gas;
   a substrate;
   means for exposing the substrate to the supplied reactive material gas and the supplied oxidizing gas;
   a laser generating a beam of laser light; and
   means for applying the laser light beam to the substrate through the reactive material gas and the oxidizing gas;
   wherein the laser light beam activates the oxidizing gas, and the activated oxidizing gas reacts with the reactive material gas to form an oxide deposited on the substrate.

2. The apparatus of claim 1 further comprising means for controlling a temperature of the substrate.

3. The apparatus of claim 1 further comprising means for moving the substrate relative to the laser light beam.

4. The apparatus of claim 1 wherein the laser light beam has a wavelength in the range of 200 to 300 nm.

5. The apparatus of claim 1 wherein the laser light beam has a wavelength of 266 nm.

6. The apparatus of claim 1 wherein the laser light beam has a wavelength of 257 nm.

7. The apparatus of claim 1 wherein the laser comprises an excimer laser.

8. The apparatus of claim 1 wherein the oxide is selected from the group of $SnO_2$, $SiO_2$, $Al_2O_3$, $K_3Li_2NbO_{15}$, and indium tin oxide.

9. The apparatus of claim 1 further comprising means for holding a temperature of the deposition of the oxide in the range of 250° to 300° C.

10. The apparatus of claim 1 further comprising means for holding a temperature of the deposition of the oxide equal to or higher than 150° C.

11. The apparatus of claim 1 wherein the exposing means comprises a chamber accommodating the substrate, and means for independently transferring the reactive material gas and the oxidizing gas to a region within the chamber, the region being close to the substrate.

12. The apparatus of claim 1 wherein the exposing means comprises a nozzle injecting the reactive material gas into a region near a point of a surface of the substrate which is exposed to the laser light beam.

13. The apparatus of claim 1 further comprising means for driving the reactive material gas in a first direction along a surface of the substrate, and means for moving the substrate relative to the laser light beam in a second direction opposite to the first direction.

14. The apparatus of claim 1 wherein the exposing means comprises means for injecting the reactive material gas and the oxidizing gas into a first region near a point of a surface of the substrate which is exposed to the laser light beam, and means for supplying an inert gas to a second region surrounding the first region to prevent a leakage of the reactive material gas and the oxidizing gas from the first region to the ambient surroundings.

15. An apparatus for writing an oxide film, comprising:
means for supplying a gas of reactive material;
an ozonizer for supplying the oxidizing gas including the ozone gas;
a substrate;
means for exposing the substrate to the supplied reactive material gas and the supplied oxidizing gas;
a laser generating a beam of laser light; and
means for applying the laser light beam to the substrate through the reactive material gas and the oxidizing gas;
wherein the laser light beam activates the oxidizing gas, and the activated oxidizing gas reacts with the reactive material gas to form an oxide deposited on the substrate.

16. The apparatus of claim 15 further comprising means for controlling a temperature of the substrate.

17. The apparatus of claim 15 further comprising means for moving the substrate relative to the laser light beam.

18. The apparatus of claim 15 wherein the laser light beam has a wavelength in the range of 200 to 300 nm.

19. The apparatus of claim 15 wherein the laser light beam has a wavelength of 266 nm.

20. The apparatus of claim 15 wherein the laser light beam has a wavelength of 254 nm.

21. The apparatus of claim 15 wherein the laser comprises an excimer laser.

22. The apparatus of claim 15 wherein the oxide is selected from the group of $SnO_2$, $SiO_2$, $Al_2O_3$, $K_3Li_2NbO_{15}$, and indium tin oxide.

23. The apparatus of claim 15 further comprising means for holding a temperature of the deposition of the oxide in the range of 250° C. to 300° C.

24. The apparatus of claim 15 further comprising means for holding a temperature of the deposition of the oxide equal to or higher than 150° C.

25. The apparatus of claim 15 wherein the exposing means comprises a chamber accommodating the substrate, and means for mutually independently transferring the reactive material gas and the oxidizing gas to a region within the chamber, the region being close to the substrate.

26. The apparatus of claim 15 wherein the exposing means comprises a nozzle injecting the reactive material gas into a region near a point of a surface of the substrate which is exposed to the laser light beam.

27. The apparatus of claim 15 further comprising means for driving the reactive material gas in a first direction along a surface of the substrate, and means for moving the substrate relative to the laser light beam in a second direction opposite to the first direction.

28. The apparatus of claim 15 wherein the exposing means comprises means for injecting the reactive material gas and the oxidizing gas into a first region near a point of a surface of the substrate which is exposed to the laser light beam, and means for supplying an inert gas to a second region surrounding the first region to prevent a leakage of the reactive material gas and the oxidizing gas from the first region to an exterior.

29. The apparatus of claim 15 wherein the exposing means comprises:
a first cylinder defining a first passage conducting the laser light beam;
means for supplying a first inert gas to the first passage;
a second cylinder extending concentrically outward of the first cylinder, the second cylinder defining a second passage in conjunction with the first cylinder;
means for injecting the reactive material gas and the oxidizing gas into a region near the substrate via the second passage;
a third cylinder extending concentrically outward of the second cylinder, the third cylinder defining a third passage in conjunction with the second cylinder;
means for drawing the reactive material gas and the oxidizing gas from the region near the substrate via the third passage;
a fourth cylinder extending concentrically outward of the third cylinder, the fourth cylinder defining a fourth passage in conjunction with the third cylinder; and
means for injecting a second inert gas via the fourth passage and forming a tubular stream of the second inert gas which surrounds the region near the substrate and which prevents a leakage of the reactive material gas and the oxidizing gas from the region near the substrate.

30. The apparatus of claim 29 further comprising means for forming the injected reactive material gas into a linear stream, and means for drawing the linear stream of the reactive material gas via the third passage.

31. An apparatus for writing an oxide film, comprising:

means for supplying a gas of reactive material;

means for supplying the oxidizing gas including the ozone gas;

a substrate;

means for exposing the substrate to the supplied reactive material gas and the supplied oxidizing gas, said exposing means comprising:

a first cylinder defining a first passage conducting the laser light beam;

means for supplying a first inert gas to the first passage;

a second cylinder extending concentrically outward of the first cylinder, the second cylinder defining a second passage in conjunction with the first cylinder;

means for injecting the reactive material gas and the oxidizing gas into a region near the substrate via the second passage;

a third cylinder extending concentrically outward of the second cylinder, the third cylinder defining a third passage in conjunction with the second cylinder;

means for drawing the reactive material gas and the oxidizing gas from the region near the substrate via the third passage;

a fourth cylinder extending concentrically outward of the third cylinder, the fourth cylinder defining a fourth passage in conjunction with the third cylinder; and means for injecting a second inert gas via the fourth passage and forming a tubular stream of the second inert gas which surrounds the region near the substrate and which prevents a leakage of the reactive material gas and the oxidizing gas from the region near the substrate;

a laser generating a beam of laser light; and means for applying the laser light beam to the substrate through the reactive material gas and the oxidizing gas;

wherein the laser light beam activates the oxidizing gas, and the activated oxidizing gas reacts with the reactive material gas to form an oxide deposited on the substrate.

32. The apparatus of 31 further comprising means for forming the injected reactive material gas into a linear stream, and means for drawing the linear stream of the reactive material gas via the third passage.

* * * * *